United States Patent
Birafane

(10) Patent No.: US 7,953,380 B2
(45) Date of Patent: May 31, 2011

(54) HIGH EFFICIENCY RF TRANSMITTER SYSTEM USING NON-LINEAR AMPLIFIERS

(76) Inventor: Ahmed Birafane, Montreal (CA)

( * ) Notice: Subject to any disclaimer, the term of this patent is extended or adjusted under 35 U.S.C. 154(b) by 711 days.

(21) Appl. No.: 11/921,062
(22) PCT Filed: May 30, 2006
(86) PCT No.: PCT/IB2006/003379
§ 371 (c)(1), (2), (4) Date: Nov. 26, 2007
(87) PCT Pub. No.: WO2007/029119
PCT Pub. Date: Mar. 15, 2007

(65) Prior Publication Data
US 2009/0117863 A1 May 7, 2009

Related U.S. Application Data

(60) Provisional application No. 60/685,145, filed on May 27, 2005.

(51) Int. Cl.
H01Q 11/12 (2006.01)
H04K 3/00 (2006.01)
(52) U.S. Cl. .................. 455/127.3; 330/124 R
(58) Field of Classification Search ........... 455/114.1, 455/114.3, 127.1, 127.3; 330/124 R
See application file for complete search history.

(56) References Cited

U.S. PATENT DOCUMENTS
6,147,553 A 11/2000 Kolanek
6,311,046 B1 10/2001 Dent
(Continued)

FOREIGN PATENT DOCUMENTS
WO WO-02/50995 A2 6/2002
(Continued)

OTHER PUBLICATIONS

A. Birafane et al., "Phase-only predistortion for LINC amplifiers with chireix-outphasing combiners," IEEE Transactions on Microwave Theory and Techniques, vol. 53, No. 6, part 2, Jun. 2005, pp. 2240-2250.
(Continued)

Primary Examiner — Lee Nguyen
(74) Attorney, Agent, or Firm — Edwards Angell Palmer & Dodge LLP; Steven M. Jensen

(57) ABSTRACT

An RF transmitter with improved efficiency and good linearity decomposes an input AM signal into two signal envelopes with phased modulation at a phase angle $\theta$. The transmitter has three principal embodiments. A first solution uses at least one added RF amplifier for each decomposed signal envelope with one or more amplifiers having a low gain compared to that of a high gain amplifier in another branch for the same signal envelope. A phase angle $\theta_i$ is determined that corresponds to a switching on two of the 2n+2 total branches, n=0, 1, 2, .... A second solution uses the same general schematic architecture as the classic LINC system that requires only two RF amplifiers, but uses a different decomposition because the two RF amplifiers are used in their nonlinear zone. The decomposed signal envelopes can be variable. The amplified output signal allows the combiner to be used at 100% efficiency in major part of signal. The third solution combines the first and second solutions.

15 Claims, 7 Drawing Sheets

U.S. PATENT DOCUMENTS

| | | | |
|---|---|---|---|
| 6,313,703 | B1 | 11/2001 | Wright et al. |
| 6,633,200 | B2 | 10/2003 | Kolanek |
| 6,737,914 | B2 | 5/2004 | Gu |
| 6,819,171 | B2 | 11/2004 | Kenington |
| 6,853,244 | B2 | 2/2005 | Robinson et al. |
| 2002/0027958 | A1 | 3/2002 | Kolanek |
| 2003/0107435 | A1* | 6/2003 | Gu .................. 330/149 |
| 2004/0101065 | A1 | 5/2004 | Hagh et al. |
| 2004/0185805 | A1 | 9/2004 | Kim et al. |

FOREIGN PATENT DOCUMENTS

WO    WO-2004/036736 A1    4/2004

OTHER PUBLICATIONS

A. Birafane et al., "Distortion free LINC amplifier with chireix-outphasing combiner using phase-only predistortion," 34th European Microwave Conference, 2004, vol. 2, Oct. 13, 2004, pp. 1069-1072.

A. Birafane, "On the linearity and efficiency of outphasing microwave amplifiers," IEEE Transactions on Microwave Theory and Techniques, vol. 52, No. 7, Jul. 2004.

A. Birafane, "An analytical approach to LINC Power combining efficiency estimation and optimization," 33rd European Microwave Conference, pp. 1227-1229, Oct. 2003.

D.C. Cox, "Linear amplification with nonlinear components," IEEE Trans. Commun., vol. COM-22, No. 12, pp. 1942-1945, Dec. 1974.

H. Chireix, "High power outphasing modulation," Proc. IRE, vol. 23, No. 11, pp. 1370-1392, Nov. 1935.

G. Rabjohn et al., Improving Efficiency, Output Power with 802.11a Out-Phasing PAs, Copyright © 2003 CMP Media, LLC, D & R Industry Articles, file://C:\Documents%20and%20Settings\akouki\My%20Documents\LINC%20MTTS\lm... (Feb. 26, 2004).

X. Zhang et al., "Design of Linear RF Outphasing Power Amplifiers," © 2003 Artech House, Boston, www.artechhouse.com, pp. 1-34.

* cited by examiner

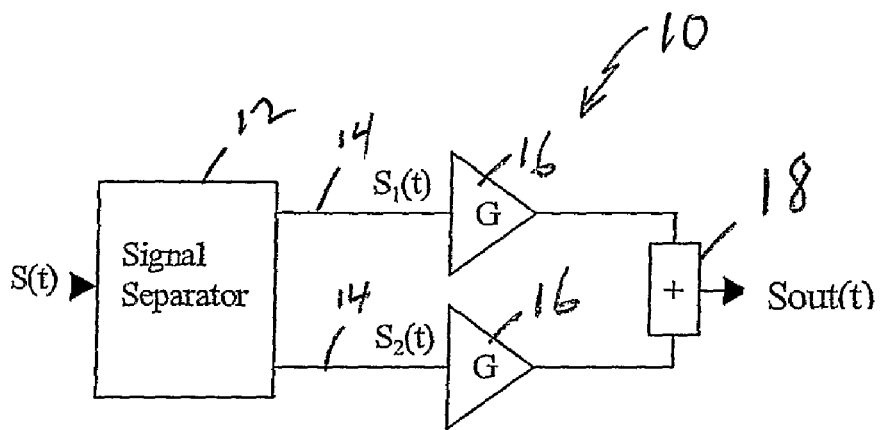
Fig: 1
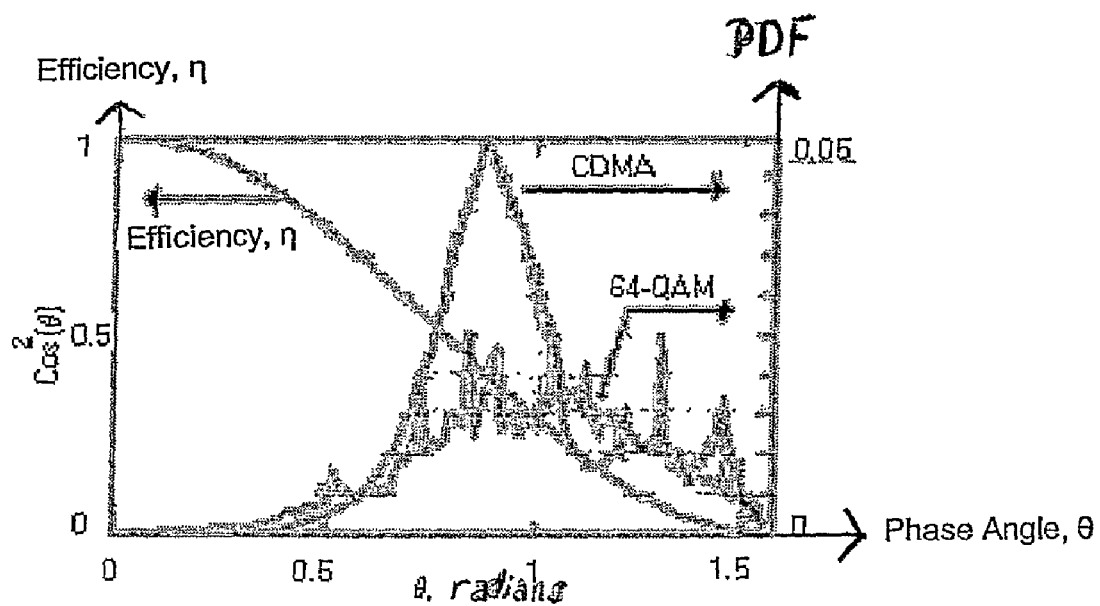
Fig: 2

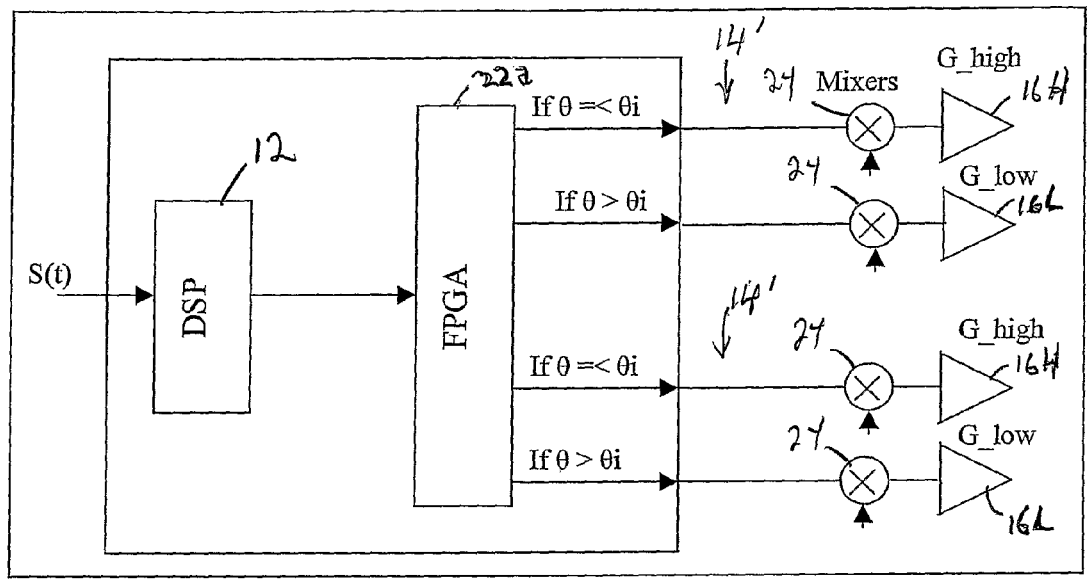
Fig:5
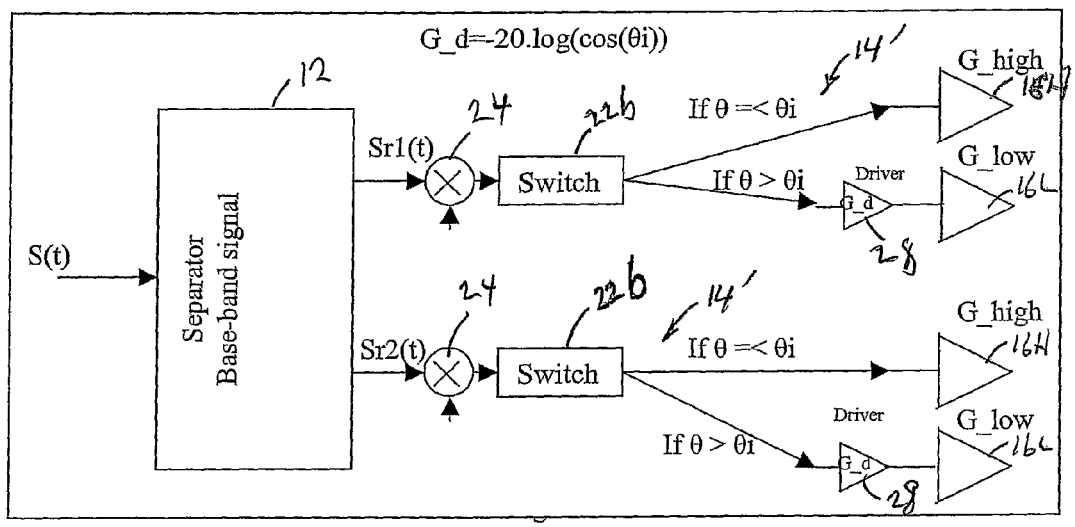
Fig. 6

Fig:7

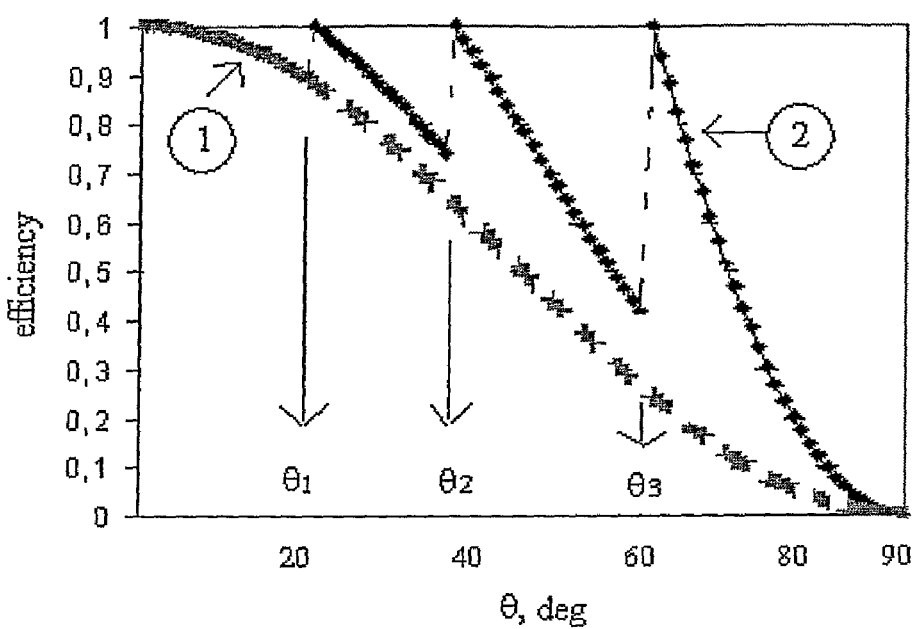
Fig. 8
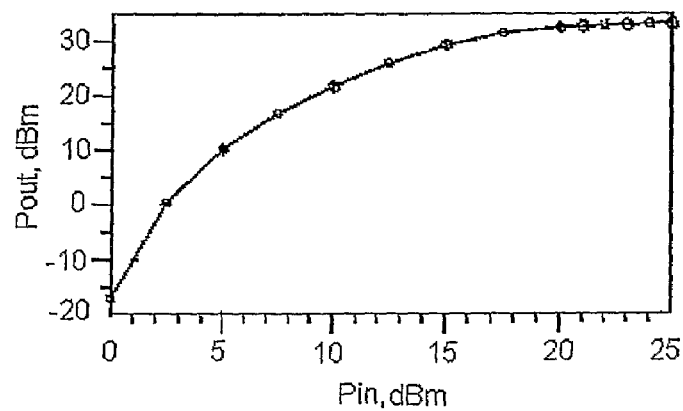
Figure: 9

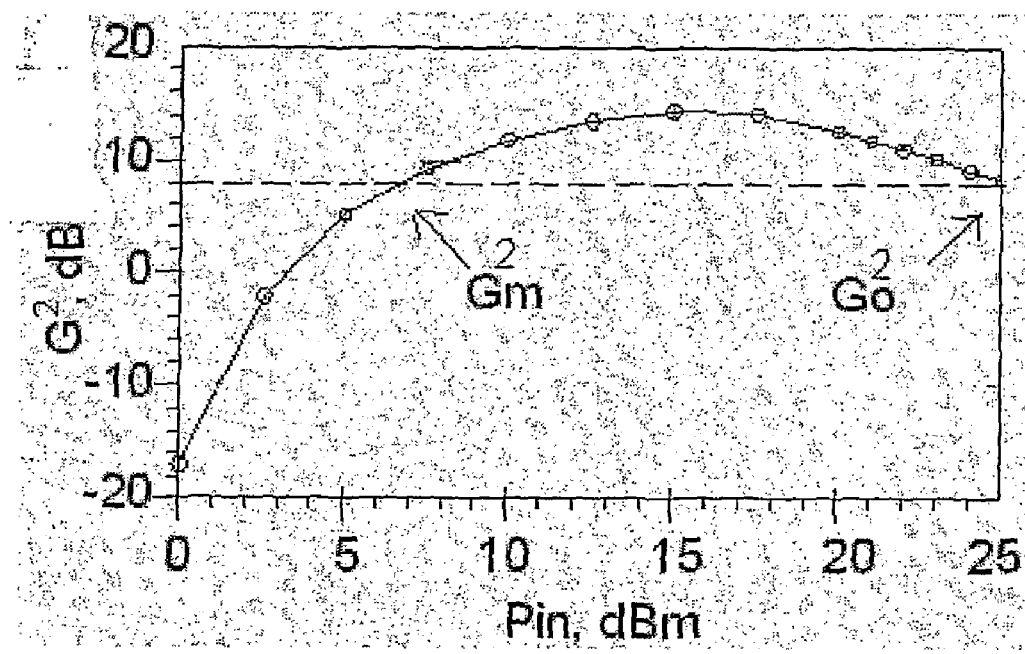
Figure: 10
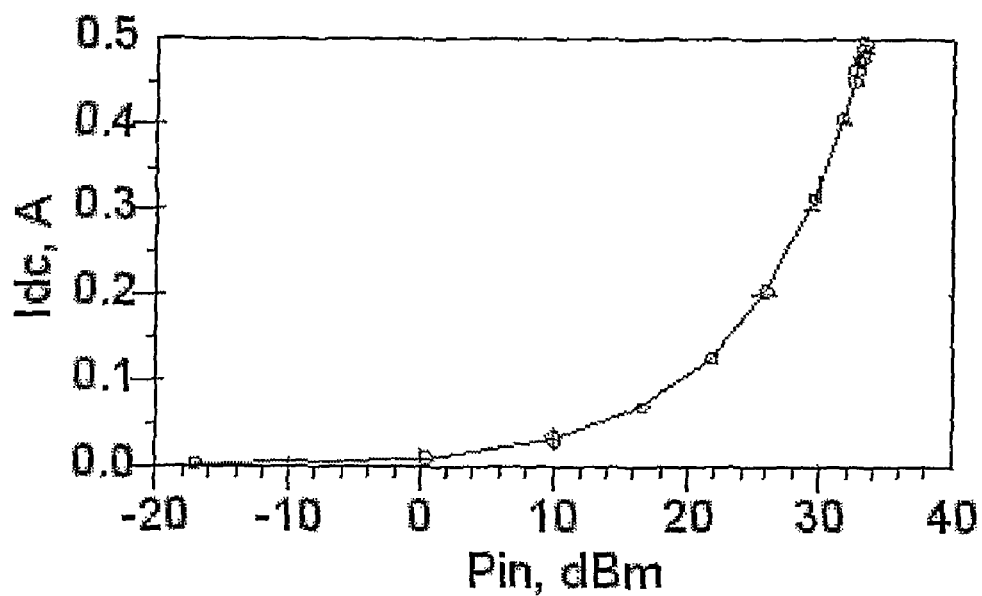
Figure: 11

HIGH EFFICIENCY RF TRANSMITTER SYSTEM USING NON-LINEAR AMPLIFIERS

CROSS-REFERENCE TO RELATED APPLICATION

This application claims the benefit of U.S. provisional application No. 60/685,145 filed May 27, 2005, the disclosure of which is incorporated herein by reference.

BACKGROUND OF THE INVENTION

This invention relates to transmitters. More specifically, it relates to transmitting apparatus and methods using non-linear amplifiers to produce linear amplification of an input signal, particularly one with high peak-to-average power, with an improved efficiency.

Modern wireless communication systems have a need for transmitters with an improved efficiency while avoiding distortion. The greatest operating cost of a base station is the cost of the electrical energy consumed by the amplifiers of the transmitter. Any significant improvement in efficiency over the known systems presents a like significant advantage in energy and cost savings.

Use of a single power amplifier, e.g. class A, limits the efficiency of the transmitter to the inherent efficiency of the amplifier, and there is no way to improve the efficiency. Various modulation schemes and communication system architectures have been proposed to improve efficiency.

One known amplifier architecture is the Chiriex system using passive stubs to control distortion. Icefyre Semiconductor has recently reported a Chiriex type amplifier system using two amplifiers plus a combiner. A digital modulation system is also known, but it requires a back off of about 5 dB PA (Power Amplifier), which introduces distortion. Ideally, however, it is optimal to operate with high efficiency at peak power.

As another example of known transmitters, D.C. Cox proposed in 1974 using two amplifiers in a "LINC" (linear amplifier with non-linear components) structure to overcome this limit on efficiency, while retaining linearity.

The LINC architecture uses a signal separator to convert the amplitude (or phase) modulation of an input signal S(t) into phase modulation of two constant (uniform amplitude) envelope signals, $S_1(t)$ and $S_2(t)$. Non-linear amplifiers, each operating at peak power with high efficiency, receive and amplify each of the constant envelope signals $S_1(t)$, $S_2(t)$ transmitted along two parallel branches. When summed at a passive, hybrid combiner, the signal envelopes $S_1(t)$ and $S_2(t)$ reproduce a linear amplification of the original signal. In this manner, the RF microwave power amplifiers can be operated at saturation with two constant envelope signals yielding maximum amplifier efficiency and, in principle, perfect linearity.

The known LINC constant envelopes signals $S_1(t)$ and $S_2(t)$ can be represented in a signal component vector or phasor diagram, such as shown in FIG. 12, where the I axis represents the in-phase component and the Q axis represents the quadrature phase component $S_1$ and $S_2$ are shown as two rotating vectors $S_1(t)$ and $S_2(t)$, each with an amplitude $r_{max/2}$ and a phase angle $\theta(t)$ with respect to the signal S(t), when in complex form, $S(t)=r(t)e^{j\Phi(t)}$, $0 \leq r(t) \leq r_{max}$.

A standard hybrid combiner, i.e., one matched at all ports with high isolation between its two branches, gives excellent linearity, but it degrades the efficiency of the LINC transmitter system. Indeed, the efficiency of a conventional LINC transmitter decreases when the peak-to-average power of the output signal increases. Yet most modulation techniques in wireless communication systems today, e.g., CDMA, WCDMA, MQAM (M 64), and OFDM signals, present a high peak-to-average power. With such signals applied to known LINC systems, the combining structure degrades the efficiency. However, the LINC structure nevertheless is more efficient than the use of only one branch with a single RF class A amplifier. For wireless communication systems, there is therefore a need to improve the efficiency of LINC systems particularly for use with the input signals having a high peak-to-average power.

It is therefore a principal object of this invention to provide a transmitter system that operates with a substantially improved efficiency over known LINC systems, particularly when the input signal has a high peak-to-average power.

Another object is to provide this improved transmitter efficiency while maintaining a substantially linear output signal.

A further object is to provide this improved efficiency and good linearity using standard components with attendant favorable component cost and availability.

Still another object of the invention is to provide a transmitter system with the foregoing advantages that can operate over a wide range of frequencies, including RF and microwave.

Yet another object of the invention is to provide a transmitter system with the foregoing advantages that can assume a variety of configurations each of which can be optimized for a specific application.

SUMMARY OF THE INVENTION

A transmitter system, particularly one suitable as a radio frequency or microwave (hereinafter, collectively "RF") transmitter for wireless communication of amplitude modulated ("AM") input signals, has a signal separator that decomposes the time-varying AM input signal S into two phase modulated envelope signals $S_1$ and $S_2$, with phase angle $\theta$. The envelope signals $S_1$ and $S_2$ are amplified by at least one non-linear amplifiers in 2n+2 parallel branches (n=0, 1, 2, . . . ). The amplified signal envelopes $S_1$ and $S_2$ from both groups of n+1 branches are summed at a hybrid combiner to produce an output signal $S_{out}$ that is the same as the input signal $S_{in}$, but amplified substantially linearly, and with good efficiency.

The transmitter system of this invention uses one of three possible solutions (embodiments) of transmitter signals all using a base band signal with low frequency (e.g., 140 KH$_z$) and an analog part with RF frequency. The base band signal part is used to decompose the input signal (low frequency) to:
  2n+2 constant envelope signals at same low frequency (the first solution);
  Two variable envelope signals for certain amplitude levels of input signal (the second solution);
  2n+2 variable envelope signals for certain levels, and 2n+2 constant envelope signal for other levels (the third solution).

In the first solution, the analog part of the transmitter is characterized by two groups of n+1 branches, or 2n+2 total branches, n=1, 2, . . . . Each branch includes an up converter, an RF amplifier, and, in the preferred form, a λ/2 microstrip line or other transmission line that allows the continuity of signal (controls distortion at a combiner after amplification). The additional branches and amplifiers constitute an extra "stage" or stages of tuning of the amplification gain and optimized phase angle θi in response to the amplitude level of the input signal, where θi is the phase angle related to the signal envelope when switching operates to turn on and turn off certain branches. Specifically, for each amplitude level of the input signal only two branches turn on and 2n branches turn off. There is a constant envelope signal in each branch. For each level of the input signal, the two branches which are turning on are added using a hybrid combiner. If the switch is used in the analog part of the transmitter, a driver is preferably added to increase the input RF signal to the level needed.

The analog part in the second solution is characterized by only two branches (as in a conventional LINC system), with each of these branches formed by an up converter (or mixer) and an RF amplifier. The output signals of the two branches are added by using a hybrid combiner. In this second solution, the two output signals $S_1$, $S_2$ present (i) a variable envelope for certain levels of signal, where ($0<\theta 21$ $\theta_k$, $1 \leq k \leq n$) and (ii) a constant envelope signals for other levels, where $\theta_k < \theta < \theta_n$, $0_n = 90$ degrees. The system of this second solution gives good linearity using a predistortion function in the signal processing circuit.

This system gives an improved efficiency over a conventional LINC transmitter, as demonstrated by efficiency equation (22) below.

The analog part in a third solution uses two equal groups of branches, 2n+2 branches in total, as in the first solution. Each branch is composed by an up converter and RF amplifier and preferably $\lambda/2$ microstrip line or on like-functioning transmission line that provides the desired continuity of signal. For each level of the input signal only two branches tam on and 2n branches turn off. In each branch the signal $S_1$, $S_2$ is a constant envelope for certain levels, and a variable constant envelope for other levels. This third solution is a hybrid that uses the first and second solutions simultaneously.

The first solution is characterized by multiple branches of RF amplifiers. The higher the number of the branches used, the greater the overall efficiency of the transmitter system. When the required efficiency for the RF transmitter system is determined, the necessary number of the branches is then determined analytically using the formulas giving in the disclosure, particularly equation 17 below.

More specifically, knowing the type of signal (i.e., the "PDF" of signal) input to be transmitted, and assuming that all RF amplifiers used present the same value of efficiency equal to $\eta_{amp}$, then, as a first step, the value of average efficiency $\eta_{amp}$ to be reached is determined. As a second step, the expression described by equation (17) below is optimized, e.g., using MATLAB brand software, to obtain the number of RF amplifiers needed in each group of branches associated with one of the signal envelopes $S_1$, $S_2$. Thereafter the values of $\theta i$ found can be fine tuned to take into account the actual efficiency of each RF amplifier. Once, the number of branches to be added is determined, the gain of each lower gain RF amplifier used is determined analytically versus (1) the gain of the higher gain RF amplifier, and (2) $\theta i$ where "i" denotes an optimized value for each of i branches, $1 \leq i \leq n$. For each level of the input signal, the signal processor turns on only two branches, and turns off 2n branches. For each amplitude level of the input signal, the base band signal is processed by a digital signal processor (DSP) or microprocessor operating with HPGL, or VHDL, or like software to act as a digital switch. This switching chooses the two branches which are turning on. The improvement of efficiency, as modeled, is at least doubled compared to that of comparable classical LINC system.

The second solution uses the same general schematic circuit as that of the conventional LINC system—there are only two branches with one amplifier connected in each branch. However, while the general architecture is the same as in the conventional LINC system, the decomposition of the input signal is not the same. This second solution improves on the classic LINC system by tailoring and optimizing the amplification to a portion of the operating range of each of only two non-linear amplifiers, rather than using an extra stage of amplifiers and branches as in solution 1.

For a certain level of the input signal, each RF amplifier operates in an X dB range from its Power at 1 dB of compression. In this zone of operation, each RF amplifier is non-linear, and consequently the gain is not constant and the signal envelopes $S_1$ and $S_2$ are not constant. The signal processor of the second solution uses the analytical expression given by Equation 22 below to deal with this variation of gain to yield good linearity. That equation is applied as a predistortion function for the situation where the phase angle satisfies the condition $0<\theta<\theta_k$, where $\theta_k$ is the phase angle related to the signal envelope taking on values between 0 degrees and 90 degrees. In this zone of operation, the hybrid combiner operate at 100% of its efficiency. For small values of the input signal, where each RF amplifier can operate with very low level of the gain, the input signal is decomposed to two constant envelope signals $S_1$ and $S_2$ to avoid the largest distortion of each RF amplifier. In this zone of operation the hybrid combiner operate with the efficiency that varies as the cosine squared of the 0 phase angle as in a classic LINC system.

The third solution uses a combination of the first and second solutions. In the same way as the first solution, one chooses the number (2n+2) of branches to be used. The input signal is decomposed to a variable envelope for certain values of the input signal amplitude, instead of a constant envelope. For small values of the input signal amplitude, the input signal is decomposed to the constant envelope signal as in the first solution. For each value of the input signal only two branches are turning on, providing high efficiency of the system. This system yields an increased efficiency over the solutions one and two, and the linearity is good.

These and other features and objects of the present invention will be more fully understood from the following detailed description which should be read in light of the accompanying drawings.

BRIEF DESCRIPTION OF THE DRAWINGS

FIG. 1 is a schematic diagram of a LINC transmitter constructed and operated in accordance with the second embodiment of this invention;

FIG. 2 is a graph showing transmitter efficiency of a conventional LUNC type transmitter with respect to the left axis, and PDF curves characteristic of two common wireless communication signals with respect to the right axis, all as a function of the LINC phase angle $\theta$ in radians;

FIG. 5 is a detailed view of a digital part switching embodiment of the transmitter shown in FIGS. 3 and 4 with up converters/mixers after the digital switches;

FIG. 6 is a detailed view of an analog part switching embodiment of the transmitter shown in FIGS. 3 and 4 with the up converters/mixers before the analog switches;

FIG. 8 is a graph showing as curve 2 the efficiency of the three (n=2) transmitters shown in FIG. 7 with phase angles θ, θ$_2$, and θ$_2$ associated with each amplifier;

FIG. 9 is a graph showing the characteristic output power as a function of input power for a class F RF amplifier, e.g. the amplifier used in FIG. 1 in the second embodiment of the present invention;

FIG. 10 is a graph corresponding to FIG. 9 but using the power gain of the same class F RF amplifier as a function of the power input to the amplifier;

FIG. 11 is a graph showing a characteristic DC current of the RF amplifier as a function of the input power.

DETAILED DESCRIPTION OF THE PREFERRED EMBODIMENTS

Figure 12:
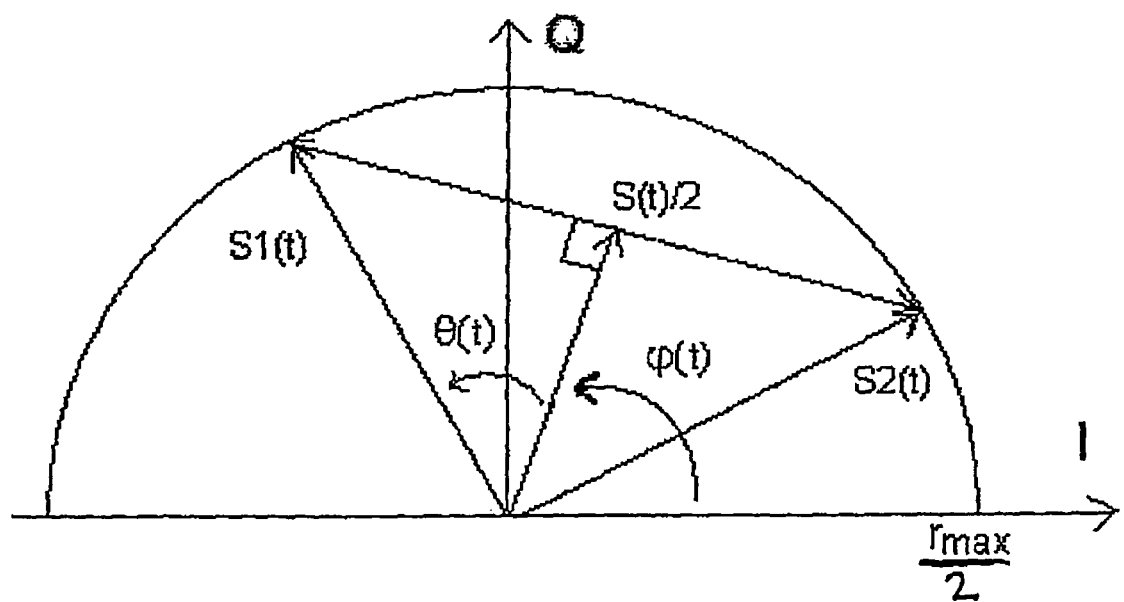
FIG. 12 is a signal component vector diagram of the signal components in a conventional LINC transmitter separated into time (t) varying constant signal envelopes S$_1$(t) and S$_2$(t) with a phase angle difference θ with respect to the signal S(t).

FIGS. 1 and 12 illustrate the main building blocks of a LINC amplifier 10, a signal separator 12 that received an input signal S(t), two branches 14, 14 that carry decomposed or separated signals S$_1$(t) and S$_2$(t), amplifiers 16, 16 each with a gain G that amplify the separated signal, and a combiner 18 that passively combines the signals S$_1$ and S$_2$ to produce the output signal S$_{out}$(t), which is S(t) substantially linearly amplified. The equations (1-4) give the various relationships between the signals.

$$S(t) = r(t) \cdot e^{j \cdot \Phi(t)} = S_1(t) + S_2(t) \tag{1}$$

$$r(t) = r_{max} \cdot \cos(\theta(t)) \tag{2}$$

$$S_1(t) = \frac{r_{max}}{2} \cdot e^{j(\varphi(t) + \theta(t))} \tag{3}$$

$$S_2(t) = \frac{r_{max}}{2} \cdot e^{j(\varphi(t) - \theta(t))} \tag{4}$$

The present invention focuses on the improvement of the efficiency by keeping good linearity. The instantaneous efficiency of the combining structure in the classic LINC system is given by:

$$\eta_i = \cos^2(\theta(t_i)) \tag{5}$$

Thus the average efficiency of the combiner is equal to:

$$\eta_{avgC} = \sum_i^n \eta_i p_i \tag{6}$$

where p$_i$ is the instantaneous value of the probability density function ("PDF") of the input signal. The average efficiency of the LINC system is:

$$\eta_{avgT} = \eta_{avgC} \cdot \eta_{amp} \tag{7}$$

The two RF amplifiers 16, 16 used in the LINC operate at high efficiency (Class B, C, F or other equivalent, e.g., Class D or E), each of them has an efficiency equal to η$_{amp}$.

FIG. 2 illustrates the problem of degradation of efficiency. The curve corresponding to the efficiency (cosines square) of conventional LINC matched combiner shows a high value when the PDF signal takes a low value (θ near to 0 radian). When the cosines square takes a low value (near to θ=π/2 or 1.57 radian), the PDF of the signal (right hand scale) takes a high value. Equation (6) shows the average efficiency of the combine, n$_{avg}$, as the product of the two terms, efficiency η$_i$ and the PDF. This demonstrates why the efficiency of LINC matched combiner is degraded when a signal with high peak-to-average is occurred—a high peak-to-average power means that the PDF of signal takes its high values near to θ=π/2 (see FIG. 2), when the cos θ value is low and dominates.

I. First Solution for Improving Efficiency and Giving Good Linearity

A—One Added Stage of RF Amplifier

Figure 3:
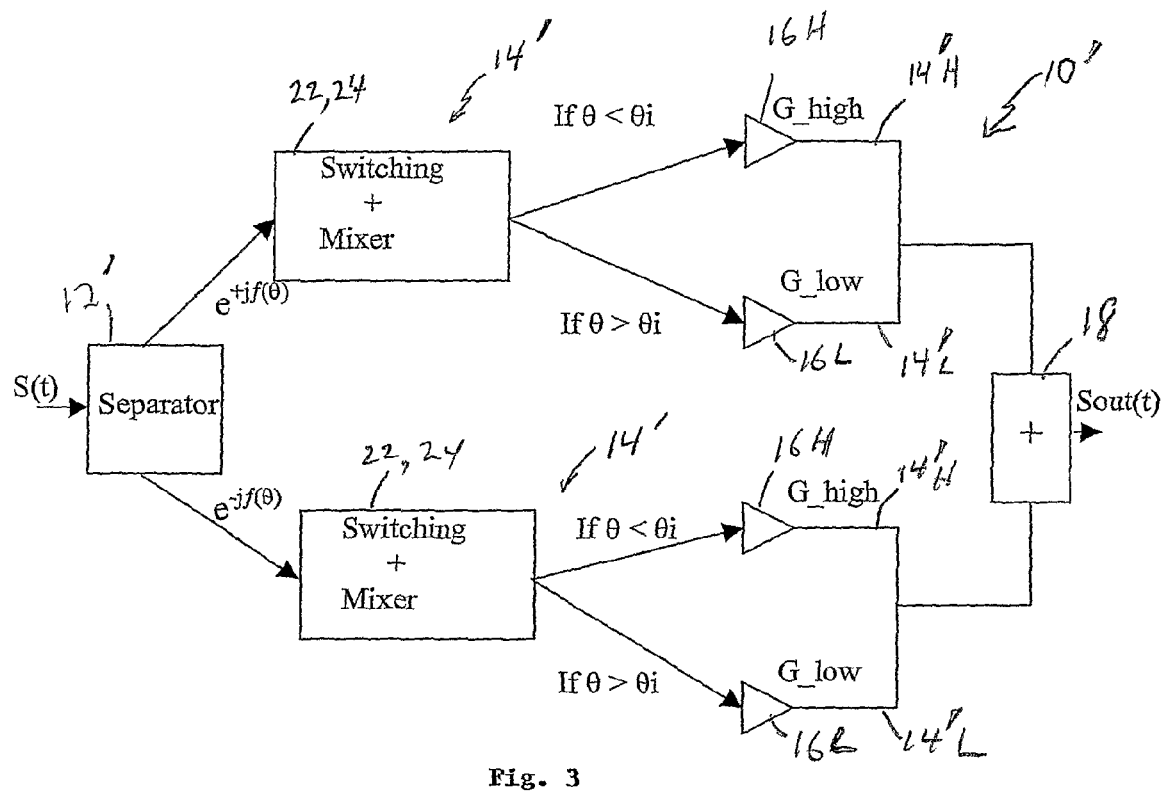
FIG. 3 is a schematic diagram of a first embodiment of an RF transmitter according to the present invention with one extra stage as compared to a conventional LINC transmitter system.

In this embodiment of the present invention, with reference to the RF transmitter 10', FIG. 3, the AM input signal S(t) is transformed at the signal separator 12 into two constant amplitude envelopes S$_1$(t) an S$_2$(t) as defined below:

$$S_1(t) = \frac{r_{max}}{2} \cdot e^{j(\varphi(t) + f(\theta))} \tag{8}$$

$$S_2(t) = \frac{r_{max}}{2} \cdot e^{j(\varphi(t) - f(\theta))} \tag{9}$$

with $$f(\theta) = \begin{cases} \theta & \text{if } \theta = < \theta i \\ \cos^{-1}\left[\frac{Cos(\theta)}{Cos(\theta_i)}\right] & \text{if } \theta > \theta i \end{cases} \tag{10}$$

If θ<θi:

In this case S(t) is decomposed in the same manner as described by the equations (3) and (4). The instantaneous efficiency used corresponds to that shown in FIG. 2. The separator 12' uses the low frequency base band signal to determine the two constant envelops S$_1$(t) and S$_2$(t). The separator 12' is shown in FIG. 5 as having a digital signal processing DSP programmable card and/or microprocessor controller 20, and a FPGA (Field-Programmable Gate Array) 22 that switches using VHDL ((VHSIC (Very High Speed Integrated Circuit) Hardware Description Language). After using a mixer (up converter) 24 the signal in each branch 14', 14' passes through one of the two RE amplifiers 16H, 16H which present a voltage gain equal to G_high. The two RF amplifiers 16L, 16L with G_low are turned off. The output voltage in the first solution, with θ<θ$_{i1}$ is defined as:

$$Vout = \frac{r_{max} \cdot G\_high \cdot Cos(\theta)}{\sqrt{2}} \tag{11}$$

If θ>θi:

For θ values beyond θi the two switches 22 (FIG. 3) change the way the signal S is then introduced to the two RF power amplifiers 16L, 16L with G_low as their voltage gain. The two RF amplifiers 16H, 16H with G_high as voltage gain are turned off by the switches. The output voltage is defined by:

$$Vout = \frac{r_{max} \cdot G\_low \cdot Cos(\theta)}{\sqrt{2} \cdot Cos(\theta i)} \tag{12}$$

Linearity and Efficiency

In this first solution, four-branch (14'H, 14'L, 14'H, 14'L) embodiment, when θ=θ$_i$, and considering equations (11) and (12), the condition of continuity of signal requires that $$G\_low = G\_high \cdot Cos(\theta i) \tag{13}$$

Because all the RF amplifiers 16H, 16L used present the same power level at input (input voltage equal to $r_{max}/2$), the "second" RF amplifiers 16L, 16L (G_low) give a low level of the output power compared to the "first" RF amplifiers 16H, 16H (G_high). The difference between the two power levels is 20 Log(Cos($\theta$i)). Moreover if the phase of the low level RF amplifier 16L is equal to that of high level RF amplifier 16H, then the output signal must be linear. If not, then one needs to consider correction of the phase in the base band signal and/or in analog part of circuit in order to produce good linearity at the output. The efficiency of system becomes:

$$\eta_{avgT} = \eta_{high} \sum_{0 \leq \theta_k \leq \theta i} \cos^2(\theta_k) \cdot p_k + \frac{\eta_{low}}{\cos^2(\theta i)} \sum_{\theta_m > \theta i} \cos^2(\theta_m) \cdot p_m \quad (14)$$

where, $\eta_{avgT}$=total average efficiency of the system $\eta_{high}$=efficiency of the RF (including microwave) amplifier with G_high set as the gain $P_k$=PDF corresponding to $\theta_k$ $\eta_{low}$=efficiency of the RE or microwave amplifier with G_low set as the gain $\theta_k$=phase angle related to the signal envelope taking the values less than $\theta$i $\theta_i$=phase angle related to the signal envelope when the switch operates $\theta_m$=phase angle related to the signal envelope taking the values higher than $\theta$i $P_m$=PDF corresponding to $\theta_m$ Compared to the efficiency of the classical LINC described by the equations (6 and 7), the efficiency of the present system is improved by the term $$\frac{1}{\cos^2(\theta i)}$$

which takes a value in excess of 1.

To choose the best value of $\theta$i, one that gives the maximum efficiency with this embodiment of the RF transmitter system of this invention, consider first that the two types of RF amplifier (high 16H and low 16L level) are "matched" in that for the purpose of a calculation to find a first approximation to an optimixed phase angle value, they are assumed to have the same efficiency value rating $\eta_{amp}$. Therefore one can solve, e.g., using well-known MATLAB brand software, equation (14) to obtain its maximum when $\theta$i is variable between 0 and 90 degrees. The calculated value of $\theta$i thus obtained can be considered as a first value to be used, but then adjusted when the actual efficiency of the two types of RF amplifier used are in fact not the same.

Figure 4:
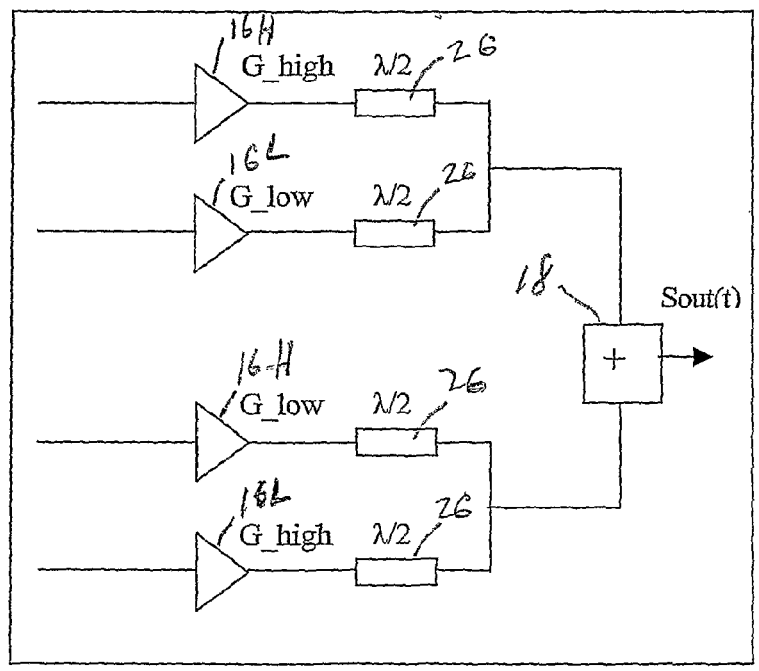
FIG. 4 is a detailed view corresponding to FIG. 3 of the output of the four branches with $\lambda/2$ microstrip lines in each branch to promote signal continuity and to control distortion at the combiner.

A class C, F or other class of operation that gives a high efficiency, e.g., Class D or B, can be used for the RF amplifiers 16H, 16L. With this type of class of operation, the output impedance of RF amplifier 16 is generally high when the input power is very low. Thus the two RF amplifiers which are turning off (when the two others are turning on in our system) present high impedance at output Consequently the use of a microstrip line 26 (FIG. 4) with $\lambda/2$ determined by the frequency of operation (or some other line with the same functional effect) as indicate is used to have good linearity at output. The use of other lengths of microstrip line than $\lambda/2$ is possible, because the length of the stub (resulting from the RF amplifier which is turning off) can be adjusted to eliminate the higher order of harmonics, and thereby increase the efficiency of the RE amplifier turning on.

Switch Position

The switch 22 can be formed as a base band switch in the base band (digital) part of signal system, or in the analog RF part of system. FIG. 5 show that the FPCA (with VHDL language) 22a can be used. The switch 22b, 22b can also be used in the RF circuits (e.g., diode switch), as shown in FIG. 6 below. In this case, as modeled, the RF design will be more accurate to avoid the distortion of the output signal.

The decomposition of the signal S(t) in the separator (Sr1(t), Sr2(t)) needs to be changed in this case as follow:

$$Sr1(t) = \begin{cases} \frac{r_{max}}{2} e^{j(\varphi(t)+\theta(t))} & \text{If } \theta = < \theta i \\ \frac{r_{max}}{2} \cos(\theta i) e^{j(\varphi(t)+f(\theta))} & \text{If } \theta > \theta i \end{cases} \quad (15)$$

where f($\theta$) is defined by equation (10), above.

The Sr2(t) component can be obtained by changing the +$\theta$ and +f($\theta$) to −$\theta$ and −f($\theta$), respectively using the expression (15). Note $S_r1$ and $S_r2$ are the decomposed or separated signal envelopes $S_1$ and $S_2$ for this RF switch design case. The RF switch is sensitive to its input power level. Therefore, two levels of power are considered at output of the separator, and a driver 28 is needed in input of the lower power level RF amplifier with power gain equal to G_d, as shown in FIG. 6.

B. Multistage Added RF Amplifiers for Further Efficiency System Architecture

Figure 7:
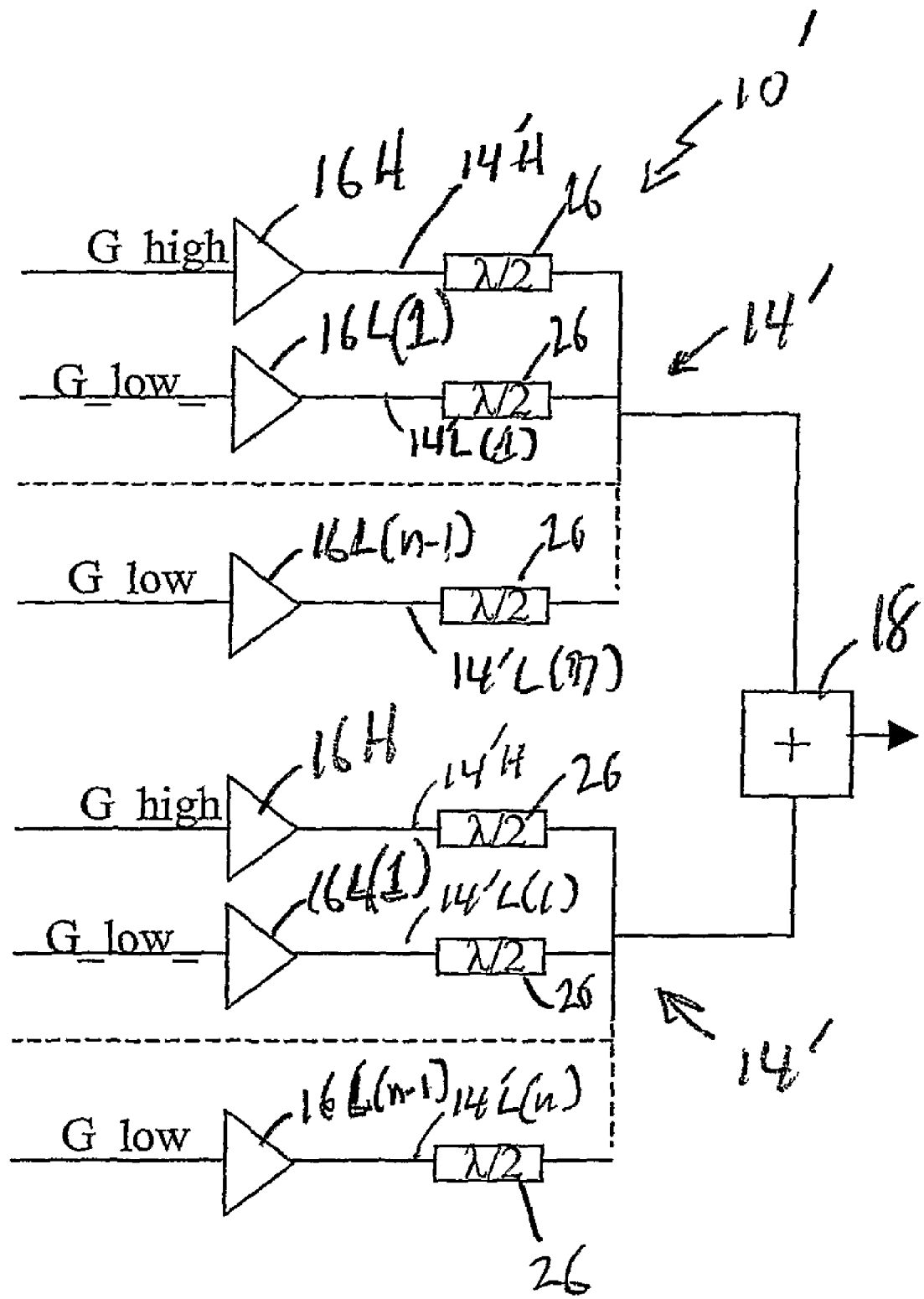
FIG. 7 is a schematic diagram of an alternative embodiment of the first embodiment of this invention showing FIGS. 3-6 using n multiple extra stages.

As an alternative, or more generalized, embodiment of the first solution, one can increase significantly the efficiency of the system 10' by increasing the number of RF amplifiers 16 in each group branch 14, 14. FIG. 7 show the schematic of this arrangement for the RF transmitter system 10' of the present invention. The design of the system becomes more complex, but the efficiency increases rapidly. The phase of each RF amplifier 15 needs to be taking into account, and then there is an adjusting in the base band signal. The use of n low power RF amplifiers 16L(1) . . . 16L(n−1) with different-voltage gain G_low_i (i=1 to n) implies that one needs to consider n values of $\theta$i ($\theta$i, i=1 to n)

The voltage gain G_high can be expressed versus G_low_i as:

$$G\_low\_i = G\_high \cdot Cos(\theta i) \, i=1 \text{ to } n \quad (16)$$

The difference between the output power of the higher RF amplifier 16H in a group branch 14', 14' and any RF amplifier 16L(1) . . . 16L(n) with a voltage gain G_low_i (i=1 to n) is equal to 20 Log(cos($\theta$i)) dB. For example when $\theta$i=60 degrees, the RF amplifier 16L (G_Low_i) operates at a 6 dB lower power level compared to the higher level power of RF amplifier 16H (G_high).

Combiner Efficiency

The instantaneous efficiency of the combiner is defined by:

$$\eta(\theta) = \begin{cases} \text{If } \theta < \theta1 & \cos^2(\theta) \\ \text{If } \theta1 < \theta < \theta2 & \cos^2(\theta)/\cos^2(\theta1) \\ \quad \ldots & \ldots \\ \text{If } \theta i < \theta < \theta i+1 & \cos^2(\theta)/\cos^2(\theta i) \\ \quad \ldots & \ldots \\ \text{If } \theta n < \theta & \cos^2(\theta)/\cos^2(\theta n) \end{cases}$$

The expression of the average efficiency becomes:

$$\eta_{Avg} = \eta_{high} \sum_{\theta k < \theta 1} \cos^2(\theta k) pk + \sum_{i=1}^{n} \frac{\eta_{low\_i}}{\cos^2(\theta i)} \cdot \left[ \sum_{\theta i+1 > \theta j > \theta i} pj \cdot \cos^2(\theta j) \right] \quad (17)$$

where, $1 \leq n$
- $\eta_{high}$=efficiency of the RF (including microwave) amplifier with G_high set as the gain
- $P_k$=PDF corresponding to $\theta_k$
- $\eta_{low}$=efficiency of the RF (including microwave) amplifier with G_low set as the gain
- $\theta_k$=phase angle related to signal envelope taking the values less than $\theta i$
- $\theta_i$=phase angle related to the signal envelope when the switch operates
- $P_j$=PDF corresponding to $\theta_j$
- $\eta_{avg}$=Average efficiency of the system The expression (17) is characteristic of the invention. It shows that the efficiency is increased by the terms $1/\cos^2(\theta i)$, which each have a value higher than 1 (for 0<$\theta i$<90 deg). As detailed above, we know the type of signal used (i.e. the PDF of an input signal S(t)) is used, and we assume for an initial optimizing calculation that all RF amplifiers 16 needed present the same value of efficiency, equal to $\eta_{amp}$. As a first step, the value of average efficiency is determined. Then, as with equation 14, the expression described by equation (17) is 16H and 16L(1) to 16L(n) optimized, e.g. using MATLAB software, to obtain the number of RF amplifiers needed in each group branch 14', 14'. Thereafter the values of $\theta i$ found can be adjusted, or "fine-tuned," to take into account the actual efficiency of each RF amplifier.

The curve 2 in FIG. 8 shows the improvement of efficiency compared to the curve 1 for a conventional LINC transmitter system (also shown in FIG. 2) For the signal with high peak to average, this improvement is larger than for other signals. As noted above, the limitations of classical LINC for many important applications is the use of signal with high peak to average powers. Compare FIG. 2 and FIG. 8 near to θ=90 degrees (π/2 or 1.57 radian), the curve 2 takes high values compared to the curve 1.

Validation Results

Using a statistical PDF of CDMA and 64QAM signals, one can model and prove that the system of the present invention is highly efficient compared to the classical LINC circuits. Consider FIG. 2, where the PDF of CDMA and 64QAM signals are shown. Using the RF transmitter system of the present invention in its first, extra stage or stages embodiment, and considering first only one added stage of RF amplifier 16L(1) (G_low_1), the resultant efficiency comparisons are given below in Table I. These results assume that a higher and a lower level of RF amplifiers used, and they are the same efficiency. Thereafter the equation (14) gives the values detailed below for one stage added, and Equation 17 for two stages using 16L(1) and 16L(2) added.

TABLE I

|  | LINC combiner efficiency | Efficiency with one stage added | Efficiency with 2 stages added |
|---|---|---|---|
| CDMA | 21% | 31% with θ1 = 50 deg | 50.5% with θ1 = 50 deg θ2 = 80 deg |
| 64QAM | 19.4% | 43.4% with θ1 = 55 deg | |

Compared to the high RF amplifier output.
θ1=50 deg corresponds to a 3.8 dB lower value than the output power of the amplifiers with high gain
θ1=55 deg corresponds to a 4.8 dB lower value than the output power of the amplifiers with high gain
θ2=80 deg corresponds to a 15.2 dB lower value than the output power of the amplifiers with high gain II. A Second Solution Providing Good Linearity and High Efficiency Analysis The second embodiment of the present invention does not use an additional stage or stages of amplifiers and associated branches. It uses only two non-Ainear RF amplifiers. Each RF amplifier is used in one branch; consequently there are only two branches (FIG. 1) as in the classic UINC structure. The decomposition of signal, however, is not the same as that developed in the classic LINC. The two RF amplifiers 16, 16 are operated generally at high efficiency (class B, C, ...), characterized by a non-constant power gain, and with non-linearity at output.

This invention uses each RF amplifier 16, 16 in its non-linear operation zone. The power output of a suitable RF amplifier with Class F as a function of input power to the amplifier is shown in FIG. 9.

In a first operating zone, from where the output power where the amplifier is highly efficient to some dB of back off, the decomposition of the input signal S(t) by the separator 12 operates to separate the input signal S into two identical signals $S_1$, $S_2$ (but not into two constant envelopes). In this zone of operation, the two RF amplifiers 16, 16 in each of the two branches 14, 14 present two signals at output which are added in phase in the combiner 18. Indeed, the combiner 18 operates at 100% of efficiency. In the analysis, only one part of signal is considered, from an output power with needed high efficiency (to the right in FIG. 9) to X dB back off, where X is to be determined as described in more detail below.

Another zone of operation, from this X dB back off point of output power to some indeterminate further dB back off, constitutes the second past of the signal. With non-constant power gain, the X dB back off of output power corresponds to a Y dB back off in the input signal power with X≠Y. In this second part of the signal, the LINC decomposition (see equations 1 to 4) is then applied the analysis here considers $\theta i$ (i=1 to n) where θ1=0 deg and θn=90 deg, when these θi values correspond to different amplitude levels of the input signal. Using equations (1) and (2), the X dB back off of output power corresponds to θk as the phase angle with k an integer determined between I and n. The first part of signal corresponds to 0<θ<θk, and the second part corresponds to θk<θ<90 deg. In other words, rather than act on the signal with extra stages of amplifiers, the input signal is broken into different parts that are handled differently by the RF transmitter to produce the desired efficiency of amplification with the requisite degree of linearity.

If 0<θ<θk

In this case, the first part of the signal, the two non-linear RF amplifiers 16, 16 operate with a variable envelope. This is contrary to the classic LINC which requires constant envelopes. The resultant output signal is distorted because of the variability and must be corrected. Signal processing of the separator microprocessor or DSP with a programmable card uses a predistortion function in the base band signal, which requires as an input the data of output power $P_{out}$ versus θ. For the given input power level corresponding to θi value (0<i<k), equation (2) stays the same and gives:

$$r(t_i) = r_{max} \cdot \cos(\theta i) \quad (18)$$

The gain $G(\theta)$ of each RF amplifier is variable with $\theta$ (non-linear operation), as shown in FIG. 10. Plotting the power gain $G^2$, dB, a square of the voltage gain G, as a function of the intake power in dBm For each value of $\theta i$ there corresponds one value Gi of the voltage gain. The equations (3) and (4) are transformed to:

$$S_1(t) = S_2(t) = \frac{r_{max}}{2}\cos(\theta i) \cdot e^{j\varphi(t)} \quad (19)$$

The output signal $S_{out}$ is defined as follow:

$$Sout(t_i) = \frac{r_{max}}{\sqrt{2}} \cdot Gi \cdot \cos(\theta i) \cdot e^{j(\varphi(t_i)+\psi_i)} \quad (20)$$

where $\psi_i$ is the phase of the RF amplifier at each branch when the input signal corresponds to $\theta i$.

Consequently there are two sources of distortion of the output signal. The first source consists on the phase variation of the RF amplifier, and the second source is the gain variation of the RF amplifier. To correct the distortion caused by gain variation, the output signal must be proportional to the term $Go\cdot\cos(\theta i)$. For that one can use the data of voltage gain versus $\theta i$ (as given in FIG. 10) in the base band signal and then can look for $\theta j$ value which verifies:

$$Gj \cdot \cos(t) = Go \cdot \cos(\theta i) \quad (21)$$

Then, the phase introducing by the RF amplifier is $\psi_j$ which is corrected by simple phase adjustment in the input signal using the separator 12 (base band signal). If the above corrections, using Equations 20 and 21, constitute the predistortion function of the second embodiment of the invention, then, when they are cared out, the output signal $S_{out}$ must be linear, and free of distortion due to the amplification.

The resultant efficiency $\eta_1$ of the first signal part, or operation in the first zone of operation of the non-linear amplifier is defined by, $$\eta_1 = \eta_{amp} \cdot \sum_{i=1}^{k}\left[\frac{\text{Idc\_max}}{\text{Idc\_j}}\right]\cos^2(\theta i)pi \quad (22)$$

where $\eta_{amp}$ is the maximum of efficiency of the RF amplifiers, Idc_max is the DC current corresponding to maximum of efficiency $\eta_{amp}$ (($\theta o=0$ deg), and Idc_j is the DC current corresponding to $\theta j$. For each value of i there corresponds one value of j.

FIG. 11 shows a curve of Idc versus input power for the RF amplifier of FIGS. 9 and 10. The Idc current decreases when $\theta$ increases. The term Idc_max/Idc_j is high compared to 1 value, and increases when $\theta$ increases. Hence the efficiency of the transmitter of the present invention is increased compared to that of the classical LINC transmitter.

If $\theta k < \theta < \theta n$

In this case, the second signal part described above, the INC decomposition is applied, with the resultant efficiency $\eta_2$ of the second part of the amplifier zone of operation defined by:

$$\eta_2 = \eta_{amp} \cdot \sum_{i=k+1}^{n} \cos^2(\theta i)pi \quad (23)$$

The total average efficiency of the RF transmitter system of the present invention, considering both parts 1 and 2, is defined as below.

$$\eta_{avg} = \eta_1 + \eta_2 \quad (24)$$

Note, however, the choice of $\theta k$, corresponding to the limit of one part of signal, is made by using equation (22) and optimizing the equation (24) to find the better efficiency needed.

III. Third Solution of Mixing the First and the Second Solutions Simultaneously

The third solution or embodiment of this invention applies the two solutions 1 and 2 described above simultaneously. That means, in the multistage solution (FIG. 7) each RF amplifier 16H, 16L(1) . . . 16L(n−1) is used with a non-constant envelope, instead of a constant envelope. In the multi-stage RF amplifiers with G_high, G_low_i (i=1 to n−1), one applies the second solution in the condition $0<\theta<\theta k$. With the last RF amplifier (G_low_n_1) one applies the second solution completely, i.e. one considers the second part of signals described above with respect to solution/embodiment 2.

The new average efficiency $\eta_{avg}$ is:

$$\eta_{Ave} = \eta_{high}\sum_{\theta k<\theta 1}\left[\frac{Idc^{high}\_max}{Idc^{high}\_k}\right]\cos^2(\theta k)pk + \quad (25)$$

$$\sum_{i=1}^{n-1}\eta_{low\_i}\left[\sum_{\theta i+1>\theta j>\theta i}\left[\frac{Idc^{low\_i}\_max}{Idc^{low\_i}\_k}\right]pj \cdot \cos^2(\theta j)\right] +$$

$$\eta_{low\_n}\left[\sum_{90>\theta j>\theta n} pj \cdot \cos^2(\theta j)\right]$$

In this embodiment, one can optimize (25) to find a best value of $\theta i$ i=1 to n to obtain a best efficiency.

Using an RF transmitter according to the present invention, one can achieve a significant improvement in the overall efficiency of the system as compared to prior art RF transmitter systems, with good linearity of the output signal. The RF transmitter of the present invention is particularly effective when used with modern wireless input signals with high peak-to-average power profile. The system of the present invention utilizes conventional components, and can operate over a wide range of RF (including microwave) frequencies.

While the invention has been described with respect to its preferred embodiment, it will be understood that various modifications and alternatives will occur to those skilled in the art. For example, while the various optimizations, e.g., of $\theta i$, or calculations of the optimal number of branches to be used for a given efficiency, is described as calculated with MATLAB software (run on any suitable computer, e.g., a conventional p.c.), other software and arrangements will occur to those skilled in the art to carry out these and like calculations. Also, while $\lambda/2$ microstrip lines and like transmission lines are described as facilitating the transmission of the signal from the branches to the combiner, other impedance matching devices and techniques known to those skilled in the art can be used, albeit with the possibility of increased cost or reduced efficiency. Such modifications and variations are intended to fall within the scope of the appended claims.

What is claimed is:

1. A transmitter system that produces an amplified output signal $S_{out}$ from an amplitude modulated input signal S with low frequency base band and analog amplification at an RF frequency, comprises:

a signal separator that decomposes the input signal S into two phase modulated envelope signals $S_1$ and $S_2$ at the same low frequency and transmitted along 2n+2 total parallel branches (n=0.1, 2, . . . ), at least one RF non-linear power amplifier in each said branch, a combiner produces a substantially linear output signal $S_{out}$ from the amplified envelope signals $S_1$ and $S_2$, and a signal processor, including said signal separator, that optimizes the operation of said amplifiers as a function of the phase angle θ of the separated input signal S, wherein said signal processor includes switches associated with each of said branches, and said amplifier in each said branch associated with one of said envelope signals $S_1$ and $S_2$ comprises a high gain amplifier, and n low gain amplifiers (n≧1), wherein each of said high and low gain amplifiers is associated with an optimized θ value, θi (1≦i≦n), and wherein said switches turn on two of said RF amplifiers selected by said signal processor, and each associated with one of said envelope signals $S_1$ and $S_2$ to optimize the linearity and efficiency of said amplifiers for a given input signal S.

2. The transmitter system of claim 1 wherein said envelope signals $S_1$ and $S_2$ are constant in amplitude.

3. The transmitter system of claim 1 wherein each of said branches also includes an up converter at the input to said RF amplifier and an impedance matching component at the input to said power combiner to promote said substantial linearity.

4. The transmitter system of claim 3 wherein said impedance matching component is a half wave (λ/2) stripe where λ is set by the RF operating frequency of the system.

5. The transmitter system of claim 1 wherein said switches are located in the analog portion of the system associated with said RF amplifiers and further comprising a driver connected to increase the RF signal input to each of said low gain RF amplifiers.

6. The transmitter system of claim 1 wherein said RF amplifiers each have substantially the same efficiency value, ηamp, and an initial optimized θi value is obtained by maximizing the equation:

$$\eta_{avgT} = \eta_{high} \sum_{0 \le \theta_k \le \theta i} \cos^2(\theta_k) \cdot p_k + \frac{\eta_{low}}{\cos^2(\theta i)} \sum_{\theta_m > \theta i} \cos^2(\theta_m) \cdot p_m$$

where, n=1

$\eta_{avgT}$=total average efficiency of the system $\eta_{high}$=efficiency of the RF (including microwave) amplifier with G_high set as the gain $P_k$=PDF corresponding to $\theta_k$ $\eta_{low}$=efficiency of the RF or microwave amplifier with G_low set as the gain $\theta_k$=phase angle related to signal envelope taking the values less than θi $\theta_i$=phase angle related to the signal envelope when the switch operates $\theta_m$=phase angle related to signal envelope taking the values higher than θi $P_m$=PDF corresponding to $\theta_m$.

7. The transmitter system of claim 1 wherein n=1 and said switches are set to turn on said two high gain amplifiers when θ≦$\theta_i$, and turn on two of said low gain amplifiers, one associated with each of said envelope signals, $S_1$ and $S_2$, when θ>$\theta_i$.

8. The transmitter system of claim 1 wherein said RF amplifiers each have substantially the same efficiency value, ηamp, and an initial optimized θi (1≦I≦n) values are obtained by maximizing the equation:

$$\eta_{Avg} = \eta_{high} \sum_{\theta k < \theta 1} \cos^2(\theta k) pk + \sum_{i=1}^{n} \frac{\eta_{low\_i}}{\cos^2(\theta i)} \cdot \left[ \sum_{\theta i+1 > \theta j > \theta i} pj \cdot \cos^2(\theta j) \right]$$

where, 1≦n $\eta_{high}$=efficiency of the RF amplifier with G_high set as the gain $P_k$=PDF corresponding to $\theta_k$ $\eta_{low}$=efficiency of the RF amplifier with G_low set as the gain $\theta_k$=phase angle related to signal envelope taking the values less than θi $\theta_i$=phase angle related to the signal envelope when the switch operates $P_j$=PDF corresponding to $\theta_j$ $\eta_{avg}$=Average efficiency of the system.

9. The transmitter system of claim 1 wherein n≧2 and said switches are set to turn on said two high gain amplifiers when θ≦$\theta_i$, and turn on two of said low gain amplifiers G_low_i, one associated with each of said envelope signals, $S_1$ and $S_2$, when $\theta_i$=<θ=<$\theta_{i+1}$, and turn on two of said low gain amplifiers G_low_n, one associated with each of said envelope signals $S_1$ and $S_2$, when $\theta_n$≦θ≦90 degrees.

10. The transmitter system according to claim 9 wherein said signal separator includes at least one of a digital signal processor and/or a microprocessor controller operable with HPGL or VHDL, and said switches comprise a field programmable gate array.

11. A transmitter system that produces an amplified output signal $S_{out}$ from an amplitude modulated input signal S with low frequency base band and analog amplification at an RF frequency, comprises:

a signal separator that decomposes the input signal S into two phase modulated envelope signals $S_1$ and $S_2$ at the same low frequency and transmitted along 2n+2 total parallel branches (n=0, 1, 2, . . . ), at least one RF non-linear power amplifier in each said branch, a combiner produces a substantially linear output signal $S_{out}$ from the amplified envelope signals $S_1$ and $S_2$, and a signal processor, including said signal separator, that optimizes the operation of said amplifiers as a function of the phase angle θ of the separated input signal S, wherein said envelope signals $S_1$ and $S_2$ are identical and can be variable, said 2n+2 parallel branches is two in number (n=0), and said signal processor and separator operate to produce (i) variable envelope signals $S_1$ and $S_2$ amplified by said RF amplifiers at a high variable gain corresponding to the zone between P1 dB and Xdb back off of output power when 0<θ<$\theta_k$, and (ii) constant envelope signals $S_1$ and $S_2$ amplified by said RF amplifiers at a low gain with an efficiency corresponding to the cosine squared of the θ angle when $\theta_k$<θ<$\theta_n$, where $\theta_k$=phase related to the envelope signal which corresponds to Xdb Back off operation of RF amplifiers (1≦k≦n), and $\theta_n$=90 degrees.

12. The transmitter system of claim 11 wherein said phase angle θ is optimized, and signal processor controls the gain and phase of said RF amplifiers to produce said substantially linear output signal.

13. The transmittal system of claim 11 wherein said signal processor operates to maximize the system efficiency $\eta_{avg}=\eta_1+\eta_2$, where $\eta_1$ is the efficiency of the system when $0<\theta<\theta_k$ and $\eta_2$ is the efficiency of the system when $\theta_k<\theta<\theta_n$, $1\leq k\leq n$, $\theta_n=90$ degrees, and where $\eta_1=$ $$\eta_1 = \eta_{amp} \cdot \sum_{i=1}^{k} \left[\frac{Idc\_max}{Idc\_j}\right] \cos^2(\theta i) pi$$

and $\eta_2=$ $$\eta_2 = \eta_{amp} \cdot \sum_{i=k+1}^{n} \cos^2(\theta i) pi.$$

14. A transmitter system that produces an amplified output signal $S_{out}$ from an amplitude modulated input signal S with low frequency base band and analog amplification at an RF frequency, comprises:
   a signal separator that decomposes the input signal S into two phase modulated envelope signals $S_1$ and $S_2$ at the same low frequency and transmitted along 2n+2 total parallel branches (n=0, 1, 2, . . . ),
   at least one RF non-linear power amplifier in each said branch,
   a combiner produces a substantially linear output signal $S_{out}$ from the amplified envelope signals $S_1$ and $S_2$,
   and a signal processor, including said signal separator, that optimizes the operation of said amplifiers as a function of the phase angle θ of the separated input signal S,
   wherein said signal processor includes switches associated each of said branches, and said amplifier in each said branch associated with one of said envelope signals $S_1$ and $S_2$ comprises a high gain amplifier, and n low gain amplifiers (n≧1), wherein each of said high and low gain amplifiers is associated with an optimized θ value, θi (1≦i≦n),
   wherein said switches turn on two of said RF amplifiers selected by said signal processor, and each associated with one of said envelope signals $S_1$ and $S_2$ to optimize the linearity and efficiency of said amplifiers for a given input signal S, and
   said envelope signals $S_1$ and $S_2$ are identical and can be variable, said 2n+2 parallel branches is two in number (n=0), and said signal processor and separator operate to produce (i) variable envelope signals $S_1$ and $S_2$ amplified by said RF amplifiers at a high variable gain corresponding to the zone between P1 dB and Xdb back off of output power when $0<\theta<\theta_k$, and (ii) constant envelope signals $S_1$ and $S_2$ amplified by said RF amplifiers at a low gain with an efficiency corresponding to the cosine squared of the θ angle when $\theta_k<\theta<\theta_n$, where
   $\theta_k$=phase related to the envelope signal which corresponds to Xdb Back off operation of RF amplifiers (1≦k≦n), and
   $\theta_n$=90 degrees.

15. The transmitter system of claim 14 wherein said phase angle θ is optimized to produce an optimized high average efficiency $\eta_{avg}$ where $$\eta_{Avg} = \eta_{high} \sum_{\theta k<\theta 1} \left[\frac{Idc^{high}\_max}{Idc^{high}\_k}\right] \cos^2(\theta k) pk + \sum_{i=1}^{n-1} \eta_{low\_i} \left[\sum_{\theta i+1>\theta j>\theta i} \left[\frac{Idc^{low\_i}\_max}{Idc^{low\_i}\_k}\right] pj \cdot \cos^2(\theta j)\right] + \eta_{low\_n} \left[\sum_{90>\theta j>\theta n} pj \cdot \cos^2(\theta j)\right].$$

* * * * *